United States Patent [19]

Hotta et al.

[11] Patent Number: 4,870,033

[45] Date of Patent: Sep. 26, 1989

[54] METHOD OF MANUFACTURING A MULTILAYER ELECTRODE CONTAINING SILICIDE FOR A SEMICONDUCTOR DEVICE

[75] Inventors: Tadahiko Hotta; Osamu Hanagasaki, both of Hamamatsu, Japan

[73] Assignee: Yamaha Corporation, Japan

[21] Appl. No.: 21,187

[22] Filed: Mar. 3, 1987

Related U.S. Application Data

[62] Division of Ser. No. 840,373, Mar. 17, 1986, abandoned.

[30] Foreign Application Priority Data

Mar. 19, 1985 [JP] Japan .................................. 60-55175

[51] Int. Cl.⁴ .................... H01L 21/24; H01L 21/285
[52] U.S. Cl. .................................. 437/192; 437/200; 437/202
[58] Field of Search .............. 437/192, 195, 200, 202, 437/238, 241, 236, 245, 246, 193

[56] References Cited

U.S. PATENT DOCUMENTS

| | | | |
|---|---|---|---|
| 3,465,211 | 9/1969 | Adams | 357/71 |
| 4,228,212 | 10/1980 | Brown et al. | 437/192 |
| 4,545,116 | 10/1985 | Lau | 357/67 |
| 4,585,515 | 4/1986 | Maa | 156/643 |
| 4,751,198 | 6/1988 | Anderson | 437/200 |
| 4,777,150 | 10/1988 | Deneuville et al. | 437/200 |
| 4,800,177 | 1/1989 | Nakamae | 437/193 |

FOREIGN PATENT DOCUMENTS

| | | | |
|---|---|---|---|
| 54-149465 | 11/1979 | Japan | 437/202 |
| 58-143570 | 8/1983 | Japan . | |
| 2077993 | 12/1981 | United Kingdom | 437/200 |

*Primary Examiner*—Olik Chaudhuri
*Attorney, Agent, or Firm*—Spensley, Horn, Jubas & Lubitz

[57] ABSTRACT

An electrode using Ti or Zr having a highly reactive property but insuring a good and stable electric contact with a silicon semiconductor device surrounded by an oxygen atom-containing insulating film is realized with simplified and reduced manufacturing steps at a reduced cost by first revealing a selective surface region of the silicon semiconductor through a window, and then laminating thereon including the selective surface region a first metal layer of Ti or Zr and then a second metal layer of Mo or W to cover and protect the first metal layer from oxidation, and then etching away the laminated layers leaving that portion corresponding to the selective surface region of the device, and thereafter heating the assembly to form a silicide of the first metal with silicon of the underlying semiconductor. The upper metal layer is covered with a protective insulating layer to avoid oxidation of the upper metal layer. The step of covering with the protective insulating layer should preferably be taken before the heat-treatment for the silicide formation.

8 Claims, 1 Drawing Sheet

METHOD OF MANUFACTURING A MULTILAYER ELECTRODE CONTAINING SILICIDE FOR A SEMICONDUCTOR DEVICE

This is a division of application Ser. No. 840,373, filed on Mar. 17, 1986, now abandoned.

BACKGROUND OF THE INVENTION

(a) FIELD OF THE INVENTION:

The present invention relates to an electrode for producing an electric contact on a silicon semiconductor device, and more particularly it pertains to a thin film electrode containing a thin film of a metal silicide, and still more specifically it concerns such an electrode of the type mentioned above which contains a silicide of a metal such as titanium or zirconium having a high melting point and a drastic chemically reactive property, and also it relates to a method of manufacturing such an electrode.

(b) DESCRIPTION OF THE PRIOR ART:

In the past, it is well known in the field of semiconductor devices to provide a contact hole or window at a predetermined site of a silicon semiconductor device such as IC or LSI, and to form a thin film of a metal silicide on the exposed surface portion of the silicon single or polycrystal substrate located within said window in order to make an electric contact (which usually is ohmic contact and rarely rectifying contact), by first depositing a thin film of a metal on said exposed surface by sputtering or like technique and then subjecting the resulting assembly to a heat-treatment.

Among such prior art techniques, the earliest-proposed and well known is the one developed by BTL (Bell Telephone Laboratory) which represents the formation of a thin film of platinum silicide by heat-treatment of a thin platinum film intended to provide an ohmic contact of a silicon beam lead transistor.

A brief description of the instance wherein the above-mentioned manufacturing method is applied to a silicon planar device will be made below. An $SiO_2$ film is formed on the surface of a silicon single crystal substrate by, for example, thermal oxidation, and thereafter a contact hole or window is provided through said film by relying on the ordinary photolithographic technique. Then, a thin platinum layer is deposited by, for example, sputtering on the $SiO_2$ film including the exposed surface of the contact hole. The resulting substrate is subjected to a heat-treatment. Whereupon, platinum reacts with silicon only within the contact hole and a platinum silicide is produced excepting the remaining $SiO_2$ film areas which are left there intact. The resulting assembly is rinsed with aqua regia (royal water), resulting in that only platinum is selectively etched away, and a platinum silicide layer is retained in the contact hole. Thereafter, a layer of a different metal such as titanium (Ti) is deposited so as to cover the platinum silicide layer which has been already formed. Then, by an ordinary photolithographic technique, an electrode containing a platinum silicide and having a predetermined pattern is formed.

In accordance with the subsequent development of technology, there has become adopted a method of producing an electrode which is comprised of a thin film of a metal such as molybdenum (Mo) or tungsten (W) having a higher melting point to serve as a metal for providing an electric contact of a semiconductor device such as Si-LSI, or to use the silicides of these metals, i.e. $MoSi_2$ or $WSi_2$, for the production of an electrode to make electric contact with the silicon surface of the device by subjecting these metals in their state of contacting the silicon surface of the substrate to a heat-treatment. These electrodes and their manufacturing methods have been accepted as important techniques for the formation of contact electrodes of semiconductor devices such as said LSI which requires a high degree of precision or high packing density, or for the formation of micro-lead films.

The above-described electrode which contains the formation of a platinum silicide by the use of platinum is relatively easy to manufacture since it requires only one step of photolithography. However, in view of the platinum being a very expensive metal as one reason, there have become employed molybdenum and tungsten in place of the precious platinum However, the attempt to further develop the above-mentioned technique by using a metal film of Ti or Zr having a higher reactivity and a higher melting point for the formation of a silicide of these metals through a heat-treatment, however, has been found to be entailed by various problems That is, as an example of such problems, description will be made with respect to an instance wherein an electrode containing a titanium silicide is formed by using titanium in place of platinum. During a heat-treatment which is conducted in the state of the titanium film covering not only the exposed silicon surface portion located within the contact hole but also being stacked over the $SiO_2$ film, a problem was found to arise that a titanium silicide was formed not only within the contact hole but also on the $SiO_2$ film as well. This formation of titanium silicide on the $SiO_2$ film is due to the following reasons that titanium has chemically more active characteristics for oxygen atoms rather than for Si atoms, so that this reaction breaks the bonding between silicon atoms and oxygen atoms in the silicon oxide, and the resulting freed silicon atoms react with titanium atoms.

A titanium silicide layer is thus formed not only within the contact hole alone but also on the entire surface of the $SiO_2$ film as well. It is, therefore, impossible to selectively and discriminatingly etch only that Ti silicide film portions located on the $SiO_2$ film, unlike the instance of the platinum film wherein such a discriminating etching is possible Hence the need to conceive a specific counter-measure therefor. As one example of the counter measure, there is the technique that a layer of titanium film is formed first on the entire surface, and then by relying on the photolithography, the titanium layer is retained only in the area substantially corresponding to the contact hole, and thereafter a titanium silicide layer is formed in the region substantially corresponding to the contact hole. In case such a method is adopted, there will occur such inconveniences that oxygen atoms are taken in that portion of titanium silicide which is in contact with Si, or that the surface of titanium silicide is oxidized, degrading its quality as an electric contact with the metal film which is stacked thereon, or that there appears variance of value of the contact resistance, or that the otherwise avoidable surplus photolithographic step becomes necessary.

SUMMARY OF THE INVENTION

It is, therefore, a primary object of the present invention to provide an electrode for a semiconductor device, which electrode being a thin film electrode containing a thin film of silicide of a metal having a high melting point, and said electrode being free of those problems encountered with the prior art electrode and providing a good electric contact.

Another object of the present invention is to provide an electrode of the type mentioned above for a semiconductor device having a silicon substrate whose local silicon surface portion forming a thin layer of silicide with the metal contained in a first thin metal layer overlying and contacting said silicon surface portion, the metal silicide being covered with a second thin layer of metal having a melting point higher than the temperature for forming said silicide, said second metal layer serving to avoid the formation of an oxide film on the first metal layer during the silicate-forming heat-treatment, thus providing a good electric contact when wiring or lead is provided onto the device.

A still another object of the present invention is to provide an electrode of the type mentioned above, further comprising a third thin layer comprised of an insulator material and covering said second thin layer and having a contact hole formed selectively and locally therethrough for electrical contact with any one of said metal layers, said insulator layer serving to protect the surface of the second metal layer from being oxidized during the silicide-forming heat-treatment, whereby providing a good electric contact.

A yet another object of the present invention is to provide a method of manufacturing an electrode of the type mentioned above for a semiconductor device, which method being free of those drawbacks of the prior art and yet being simple in the manufacturing process and reducing the steps of manufacture, thus lowering the cost of its manufacture.

A further object of the present invention is to provide a method of manufacturing an electrode of the type mentioned above, which method being arranged to provide a good electric contact between the stacked-up first and second thin metal layers.

A still another object of the present invention is to provide a method of the type mentioned above, which protects the first as well as the second thin metal layers treatment of the assembly intended to develop a metal silicide between the first metal layer and the silicon substrate.

Another object of the present invention is to provide a method of manufacturing such an electrode as mentioned above, which method featuring a reduced number of manufacturing steps leading to a cost-down of manufacture because only one patterning step is enough, and elimination of an intervening electrically obstructive film between the silicide layer and its protective electroconductive overlying layer, to thereby allow a good electric contact to be obtained Still another object of the present invention is to provide a method as mentioned above, which features that a lamination of a first electroconductive metal layer having a high melting point and a second electroconductive metal layer having a melting point above the temperature of the silicide-forming heat-treatment is first subjected to a patterning process, and then the assembly having the lamination of metal layers is subjected to a heat-treatment intended to produce a silicide of the first metal through reaction with the silicon contained in the silicon substrate lying directly underneath the first metal layer while the second metal layer serves to protect the first metal layer from being oxidized, whereby a good electric contact of an electrode for a semiconductor device is obtained.

These and other objects as well as the advantages of the present invention will become more apparent from the following detailed description of the present invention with respect to a preferred embodiment when taken in conjunction with the accompanying drawings.

BRIEF DESCRIPTION OF THE DRAWINGS

Like parts are assigned with like reference numerals throughout the drawings for the sake of simplicity of explanation.

DETAILED DESCRIPTION OF THE PREFERRED EMBODIMENT

Figure 1:
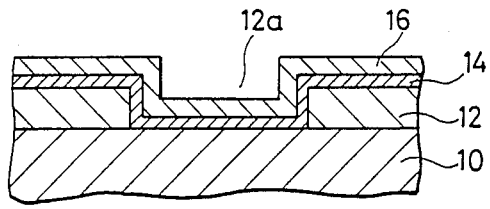
FIGS. 1 to 4 are diagrammatic sectional views showing the steps of manufacturing an electrode according to an embodiment of the present invention.
Figure 2:
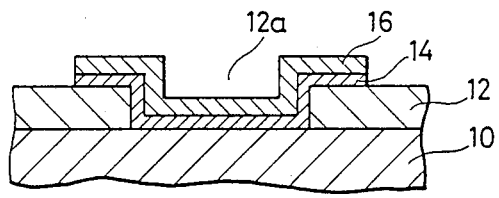
Figure 3:
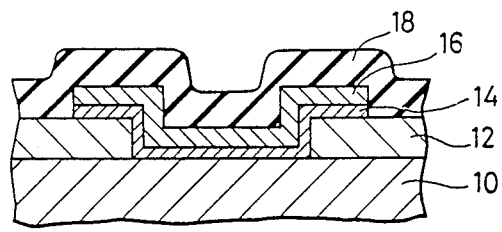

The present invention has been worked out to solve those various problems encountered in the prior art to arise in case an electrode of a thin metal film is placed onto a specific selective region of a semiconductor film of, for example, $SiO_2$ containing oxygen atoms, the surface of said region being comprised of a material which is either a single crystal or a polycrystal of silicon, and in case the electrode contacting said specific selective region of silicon is comprised of a material which is chemically reactive with oxygen atoms. In order to obtain an electrode of the present invention, there is adopted a manufacturing method comprising the step of forming a lamination of a first and second metal layer, and the step of making this lamination into a required electrode pattern, and the next step of subjecting the resulting assembly to a heat-treatment. More specifically, the electrode structure according to the present invention and its function and effect will be understood from the description of the following manufacturing steps (a) through (d).

(a) An $SiO_2$ film is formed on a surface of a semiconductor by relying on, for example, thermal oxidation, and then a contact hole or window is provided in the $SiO_2$ film through which the semiconductor is locally revealed, by relying on an ordinary photolithographic technique. In this case, the semiconductor which is employed is assumed to be either silicon (i.e. single crystal silicon) or polysilicon (polycrystal silicon).

(b) A first layer of metal which is represented by, for example, Ti or Zr, which is chemically active, especially with oxygen atoms, and a second layer of metal are provided successively in this order in laminated fashion onto the entire silicon dioxide ($SiO_2$) film so as to cover this film as well as the surface area of the contact hole.

(c) The resulting laminated two layers of metal are subjected to a patterning step, and they are selectively etched away so as to retain the laminated metal layers at least in the region corresponding to the contact hole.

(d) After this etching step, the resulting assembly is subjected to a heat-treatment to cause a reaction between the retained first metal layer and the silicon of the underlying silicon semiconductor in the region of the contact hole, to thereby form a layer of silicide.

According to the above-mentioned method of the present invention, the laminated first and second thin metal layers are first subjected to a patterning step, and then the remaining assembly is subjected to a heat-treatment to develop a silicide of the first metal. Therefore, the region of the first layer of metal which is in contact with the $SiO_2$ film will locally develop silicide also. However, because the surface of its region is covered with the second layer of metal, the other surface of the first metal layer which is covered by the second metal layer is not oxidized, so that the second metal layer can make a good and stable electric contact such as ohmic contact with its underlying silicide layer. In addition, the photolithographic step intended to obtain a required electrode pattern can be accomplished in one step, and thus this gives the advantage that the whole manufacturing process is simplified, leading to a costdown of the product device. The first metal layer is not limited to Ti or Zr layer, but it should be noted that, so long as the metal layer is comprised of such an element as will form a silicide with silicon by a heat-treatment, and especially if it is an element which is reactive with oxygen atoms, such a metal layer will be effectively used in the present invention. It should be noted here that a mixture whose principal component is either Ti or Zr and which contains some other element can be used also in the present invention.

It should be noted here that, in carrying out the method of the present invention, there is the need for selecting, as the material of the second metal layer, a metal having a melting point higher than the temperature which is employed in forming a silicide of the first metal underlying the second metal layer. For this purpose, the employment of such a metal as molybdenum (Mo) or tungsten (W) which are stable metals often used in, for example, other integrated circuits is desirable.

In case, for example, Mo or W is employed as the material of the second metal layer as described above, it should be noted that these metals are stable in many cases. However, in case there is the fear that the manufacturing process causes oxidation of these metals easily, the oxidization of these metals is prevented by covering the second metal layer with an insulating layer, and thereafter by subjecting the resulting assembly to a heat-treatment intended for developing a silicide of the first metal. By doing so, no oxide film is formed on the surface of the second metal layer during the heat-treatment. As a result, by forming a thin metal film as the lead wire on the insulating layer, and then by connecting this wiring layer electrically with the second metal layer, there is obtained a good ohmic contact.

FIGS. 1 to 4 show the electrode-manufacturing steps according to an embodiment of the present invention, and description will be made, by taking up, as an example, an electrode structure for a semiconductor device, obtained according to the present invention, in the order of the manufacturing steps (1) to (4) corresponding to the respective Figure numbers.

(1) After having formed an oxide film 12 such as $SiO_2$ on a surface of a silicon substrate 10 by, for example, thermal oxidation technique, there is formed a contact hole 12a by relying on the known photolithography locally through this silicon oxide film 12 so as to reveal a portion of the surface of the silicon substrate where to make an electric contact such as ohmic contact. Then, by relying on such a known technique as, for example, vacuum vapor deposition or sputtering, there are deposited, for example, a titanium layer 14 and a molybdenum layer 16 successively in this order and in a laminated form on the entire surface of the substrate including the recessed surface of the contact hole 12a also.

(2) Next, using a photoresist film to serve as a masking, a dry etching such as plasma etching is applied selectively, for the purpose of forming a desired electrode pattern, to the resulting titanium layer 14 and molybdenum layer 16, while preserving the lamination of these two metal layers within and in the vicinity of the contact hole 12a.

(3) Then, by relying on the CVD (Chemical Vapor Deposition) technique, an insulating layer 18 such as $Al_2O_3$, $SiO_2$ or $Si_3N_4$ is provided on the resulting entire surface of the silicon substrate so as to cover both the titanium layer 14 and the molybdenum layer 16. This insulating layer 18 is intended to protect the surface of the molybdenum layer 16 from being oxidized due to the heat to which this layer is exposed during the subsequent heat-treatment which is intended to produce the subsequently-described silicide or during any other manufacturing steps. In case, however, a multiple-layered wiring structure is required, this insulating layer 18 may be used also as an inter-layer insulating film even when there is no special fear for oxidation. It should be noted here that, in order to avoid as much as possible the oxidation of the molybdenum layer 16 (or a metal layer such as tungsten in place of molybdenum) which are easily oxidized, it is desirable to rely on, as the CVD technique, such one as the "depressed CVD" or the "plasma CVD" which give rise to no fear for oxidation, in place of the "CVD under usual pressure".

Figure 4:
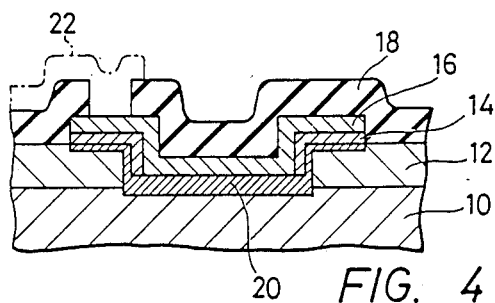

(4) Thereafter, the resulting assembly is subjected to a heat-treatment intended for silicide formation, and as a result, a titanium silicide layer 20 is formed. During this heat-treatment, the titanium layer 14 reacts with the substrate silicon, and along therewith, titanium reacts also with the silicon contained in the $SiO_2$ film 12. Thus, the titanium silicide layer 20 is formed not only at the interface between the titanium layer 14 and the silicon substrate 10, but also at the interface between the titanium layer 14 and the silicon dioxide ($SiO_2$) film 12. The depiction in FIG. 4 shows that the Ti layer 14 is retained. It will be understood easily, however, that even in case this region as a whole is turned into a silicide layer 20, the effect of the present invention is not lost in any way.

It should be noted here that, after completion of the heat-treatment intended for the silicate formation, a contact hole may be provided through the insulating film 18, and thereafter an appropriate metal may be deposited on the resulting surface, and by relying on the photolithographic technique to obtain a lead metal having a predetermined pattern, there may be formed a wiring layer 22 which is connected to the molybdenum layer 16.

According to the electrode-manufacturing method of the present invention described above, it will be noted that, during the heat-treatment step intended for silicide formation, the titanium layer 14 is already covered by the molybdenum layer 16, and this latter molybdenum layer 16, in turn, is covered by the insulating layer 18. Therefore, between the molybdenum layer 16 and the titanium silicide layer 20 or between the molybdenum layer 16 and the wiring metal layer 22, there is present no intervention of, for example, an oxidized film of metal, and thus a good and stable ohmic contact is obtained.

In the above-described embodiment, description has been made of the instance that molybdenum is used to form the second metal layer 16 and that there is the fear that this metal layer is oxidized. However, in case there is employed a metal layer which is not oxidized easily in place of the use of molybdenum, it is possible to perform the silicide-forming step of FIG. 4 by omitting the step of FIG. 3. In such a case, it is only necessary to form both the insulating layer 18 and the wiring layer 22 if necessary, after completion of the silicide-forming step of FIG. 4.

Also, in case Mo, W or like metals are employed as the material of the second metal layer, many of them remain stable and intact, but there could occur an instance that the process causes oxidation of such metal layers, and this is especially so in case tungsten (W) is employed. In case metals giving the fear for being oxidized or metals which are easily oxidized are used, arrangement is provided in the present invention so that an insulating film is provided to cover the second metal layer before performing the silicide-forming heat-treatment. Therefore, the second metal layer is prevented from being oxidized, and as a result there is the further advantage that a good electric connection is obtained between the second metal layer and the other wiring layer.

What is claimed is:

1. A method of manufacturing a two metal layer electrode for a semiconductor device having a selective surface region including a material selected from the group consisting of single crystal silicon and polycrystal silicon and intended for producing an electric contact with an overlying layer of metal and being surrounded by an insulating film containing oxygen atoms, comprising sequentially:
    a window-forming step to reveal said electric contact producing selective surface region of said semiconductor device at a predetermined surface site thereof by forming a window through said oxygen atom-containing insulating film;
    a laminated layers-forming step to deposit sequentially a first layer of metal and thereon an upper layer of metal onto said device surface that said upper layer of metal has an exposed portion for contact with said overlying layer of metal;
    a patterning step to etch away selected portions of the laminated layers of metal and to leave a portion thereof at a location corresponding to at least said selective surface region;
    an insulating layer-forming step to deposit an insulating layer to cover the upper surface of said upper layer of metal, side edges of said first and upper layers of patterned metal and the insulating film containing oxygen; and
    a heat-treating step to subject the resulting assembly to a heat-treatment to cause reaction between said first layer and silicon contained in said selective surface region underlying said first layer of metal to thereby form a silicide of the metal of said first layer.

2. A method according to claim 1, in which:
    the metal of said first layer is an element chemically reactive with the oxygen atoms contained in said insulating film; and
    the metal of said upper layer has a melting point higher than the temperature of said heat-treatment for forming a silicide.

3. A method according to claim 1, in which:
    the material constituting said first layer of metal is comprised of a member selected from the group consisting of Ti and Zr as its principal component; and
    the material of said upper layer of metal is composed of a member selected from the group consisting of Mo and W as its principal component.

4. A method according to claim 1, in which:
    the metal of said first layer is selected from the group consisting of Ti and Zr; and the metal of said upper layer is selected from the group consisting of Mo and W.

5. A method according to claim 1, further comprising:
    a step of forming a contact hole through said insulating layer covering said portion of laminated layers of metal and said insulating film to reveal a portion of said upper layer of metal; and
    a step of forming a wiring layer connected to said portion of said upper layer of metal revealed through said contact hole, said wiring layer having a different shape than the previously etched first and upper layers of metal.

6. A method according to claim 1, in which:
    said insulating layer covering the retained laminated layers of metal is comprised of a member selected from the group consisting of $Al_2O_3$, and $SiO_2$ and $Si_3N_4$.

7. A method according to claim 6, in which:
    said insulating layer covering the retained laminated layers of metal is obtained by depressed CVD technique or plasma CVD technique.

8. A method according to claim 1, in which:
    said insulating film containing oxygen is made of $SiO_2$.

* * * * *